US012615020B2

(12) United States Patent
Chen

(10) Patent No.: US 12,615,020 B2
(45) Date of Patent: Apr. 28, 2026

(54) LOAD DETECTION DEVICE FOR AUDIO AMPLIFIER SYSTEM

(71) Applicant: ELITE SEMICONDUCTOR MICROELECTRONICS TECHNOLOGY INC., Hsinchu (TW)

(72) Inventor: Isaac Y. Chen, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 463 days.

(21) Appl. No.: 18/464,290

(22) Filed: Sep. 11, 2023

(65) Prior Publication Data

US 2025/0088150 A1    Mar. 13, 2025

(51) Int. Cl.
*H03F 3/217* (2006.01)
*H03F 3/187* (2006.01)
*H04R 5/04* (2006.01)
*H04R 29/00* (2006.01)

(52) U.S. Cl.
CPC ............. *H03F 3/187* (2013.01); *H03F 3/217* (2013.01); *H04R 5/04* (2013.01); *H04R 29/001* (2013.01); *H03F 2200/03* (2013.01)

(58) Field of Classification Search
CPC ...... H03F 3/187; H03F 3/217; H03F 2200/03; H03F 3/2173; H03F 3/2171; H03F 2200/351; H04R 5/04; H04R 29/001; H04R 3/00

USPC ................ 330/10, 207 A, 251; 381/120, 121
See application file for complete search history.

(56) References Cited

U.S. PATENT DOCUMENTS

| | | | |
|---|---|---|---|
| 10,531,211 B2 | 1/2020 | Botti et al. | |
| 10,698,007 B2 | 6/2020 | Mostert et al. | |
| 10,903,802 B2 * | 1/2021 | Chadha ................. | H03F 3/2171 |
| 10,944,366 B2 * | 3/2021 | Du ........................ | H03F 3/2173 |

* cited by examiner

*Primary Examiner* — Khanh V Nguyen

(57) ABSTRACT

A load detection device includes a signal output circuit, comparison circuit, sensing circuit, detection circuit, logic circuit, and control circuit. The signal output circuit outputs a forced current, and generates a bias signal, a first output signal, a second output signal, and a feedback signal depending on the forced current. The comparison circuit compares the reference signal output with the first and second output signals to generate an accurate comparison output for indicating the load state. The sensing circuit generates a sensing signal according to the feedback signal. The detection circuit generates a rough detection output for indicating the load state according to the sensing signal and the first and second output signals. The logic circuit obtains the load state according to the precise comparison output and the rough detection output. The control circuit enables the signal output circuit, comparison circuit, sensing circuit, and logic circuit.

11 Claims, 4 Drawing Sheets

LOAD DETECTION DEVICE FOR AUDIO AMPLIFIER SYSTEM

BACKGROUND OF THE INVENTION

1. Field of the Invention

The present disclosure relates to a device, and in particular to a load detection device for an audio amplifier system.

2. Description of the Related Art

A conventional audio amplifier system includes an amplifier, a speaker, and a load detection device. The amplifier is configured to produce an amplified audio signal and output it to the speaker, so that the speaker emits sound based on the amplified audio signal. The load detection device is used to detect whether the speaker is damaged, such as a short circuit or an open circuit before the audio system enters an operating mode, in order to avoid speaker load failure. However, the conventional load detection device includes an analog-to-digital converter and/or a digital-to-analog converter, resulting in a larger circuit area of the conventional load detection device.

BRIEF SUMMARY OF THE INVENTION

Therefore, an object of the present disclosure is to provide a load detection device having a smaller circuit area, in order to solve the problem that the conventional load detection device has a larger circuit area and is difficult to form an integrated circuit with the amplifier.

Accordingly, the present disclosure provides a load detection device for an audio amplifier system, the audio amplifier system includes a first load end and a second load end that are coupled to the speaker. The load detection device includes a signal output circuit, a reference voltage generation circuit, a comparison circuit, a sensing circuit, a detection circuit, a logic circuit, and a control circuit.

The signal output circuit is coupled to the first load end and the second load end for generating and outputting a forced current to the first load end, and generating a bias signal, a first output signal related to a level of the first load end, a second output signal related to a level of the second load end, and a feedback signal depending on the forced current.

The reference voltage generation circuit is coupled to the signal output circuit to receive the bias signal, and generates a reference signal output according to the bias signal.

The comparison circuit is coupled to the signal output circuit to receive the first output signal and the second output signal, and coupled to the reference voltage generation circuit to receive the reference signal output. The reference signal output is compared with the first output signal and the second output signal to produce an accurate comparison output used to indicate a load state of the speaker.

The sensing circuit is coupled to the signal output circuit to receive the feedback signal, and generates a sensing signal according to the feedback signal.

The detection circuit is coupled to the sensing circuit to receive the sensing signal, and coupled to the signal output circuit to receive the first output signal and the second output signal, and generates a rough detection output used to indicate the load state of the speaker according to the sensing signal, the first output signal, and the second output signal. The logic circuit is coupled to the comparison circuit and the detection circuit to respectively receive the accurate comparison output and the rough detection output, and obtains the load state of the speaker according to the accurate comparison output and the rough detection output to produce a detection result.

The control circuit is used to generate an enabling signal and output to the signal output circuit, the comparison circuit, the sensing circuit, and the logic circuit, so as to enable the signal output circuit, the comparison circuit, the sensing circuit, and the logic circuit.

The effect of the present disclosure is that the signal output circuit is used to generate the forced current, the comparison circuit compares the reference signal output with the first output signal and the second output signal to generate an accurate comparison output. The sensing circuit generates the sensing signal for the detection of the detection circuit to generate a rough detection output, so that the logic circuit can obtain the load state of the speaker according to the accurate comparison output and the rough detection output. Thus, the present disclosure does not need to be equipped with an analog to digital converter and/or digital to analog converter as the existing load detection device, and the load detection device of the present disclosure has a smaller circuit area.

DETAILED DESCRIPTION OF THE INVENTION

The present disclosure will be described in detail by the following embodiments and accompanying drawings, thereby helping a person having ordinary knowledge in the art of the present disclosure to understand the objectives, features, and effects of the present disclosure. It should be noted that certain terms are used throughout the specification to refer to specific components. As those skilled in the art recognize, manufacturers may refer to the members by different names. In the following description and claims, the terms "comprising" and "including" are used in an open-ended manner and should therefore not be construed as closed terms of "consists of". In addition, the term "coupling" is intended to mean indirect or direct electrical connections. Thus, if one device is coupled to another device, this connection may be achieved through a direct electrical connection, or through an indirect electrical connection via other devices and connections. Further, in the content of the present disclosure, terms such as "first", "second", and "third" are used to distinguish differences between elements, not to limit the element itself or to indicate a particular order of the elements.

Figure 1:
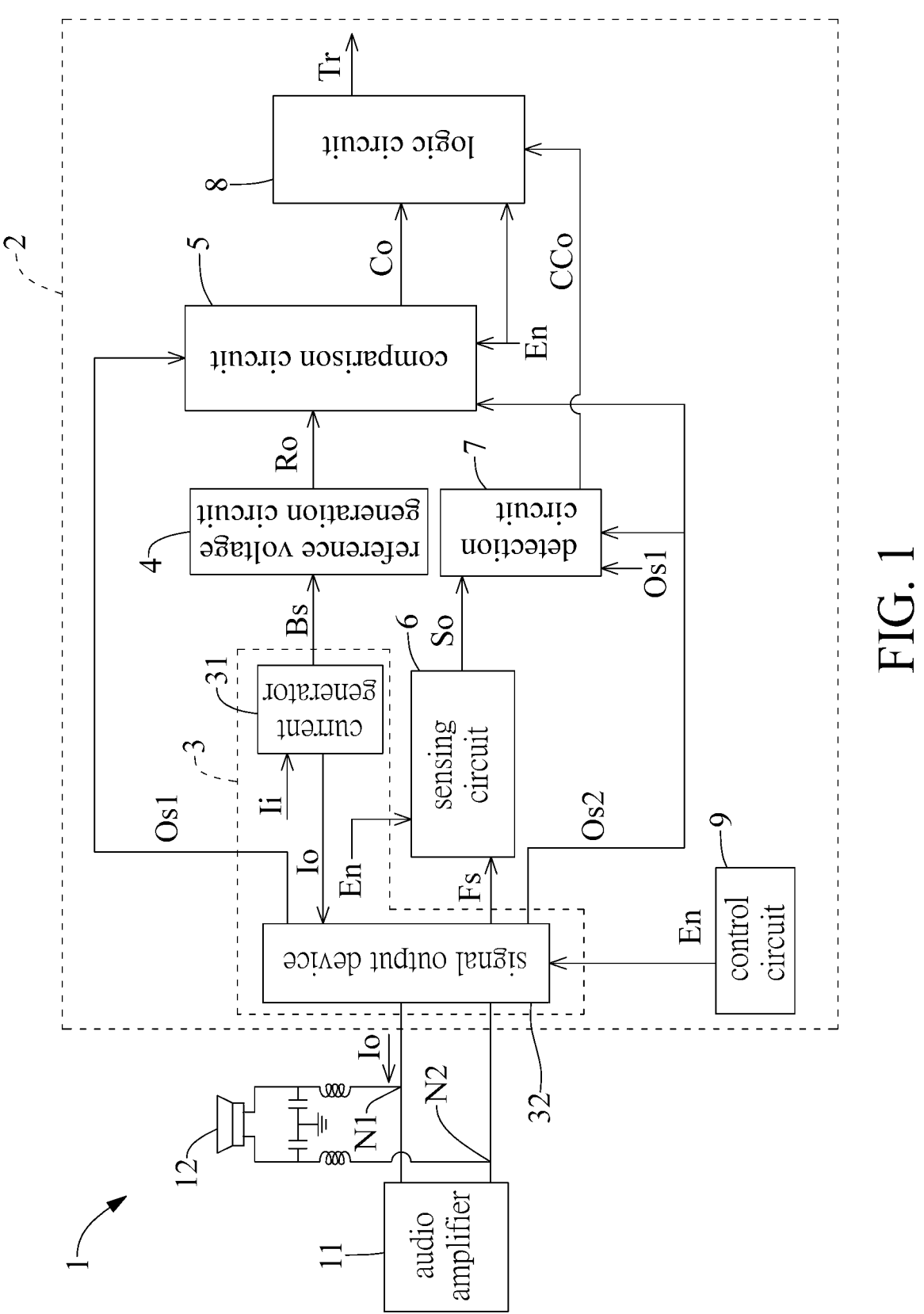
FIG. 1 is a circuit block diagram illustrating a load detection device for an audio amplifier system according to an embodiment of the present disclosure.

Referring to FIG. 1, FIG. 1 illustrates a load detection device 2 for an audio amplifier system 1 of an embodiment of the present disclosure. The audio amplifier system 1 includes an audio amplifier 11, a speaker 12, a first load end N1, and a second load end N2. The speaker 12 is coupled between the first load end N1 and the second load end N2. When the audio amplifier system 1 enters an operating mode, the audio amplifier 11 is configured to generate an amplified audio signal and output to the speaker 12, so that the speaker 12 emits sound according to the amplified audio signal. Before the audio amplifier system 1 enters the operating mode (i.e., during load detection), the load detection device 2 detects whether the speaker 12 has failed, for example, a load state of the speaker 12 is a short-circuited to ground state, a short-circuited to power state, a short-circuited state, or an open-circuited state. The load detection device 2 includes a signal output circuit 3, a reference voltage generation circuit 4, a comparison circuit 5, a sensing circuit 6, a detection circuit 7, a logic circuit 8, and a control circuit 9.

The control circuit 9 is used to generate an enabling signal En and output to the signal output circuit 3, the comparison circuit 5, the sensing circuit 6, and the logic circuit 8, so as to enable the signal output circuit 3, the comparison circuit 5, the sensing circuit 6, and the logic circuit 8. The control circuit 9 is a controller, which may be a finished product known by a person having ordinary knowledge in the art to which the present disclosure belongs.

The signal output circuit 3 is coupled to the first load end N1 and the second load end N2 for generating and outputting a forced current Io to the first load end N1, and generating a bias signal Bs, a first output signal Os1 related to the first load end N1 level, a second output signal Os2 related to the second load end N2 level, and a feedback signal Fs depending on the forced current Io.

The reference voltage generation circuit 4 is coupled to the signal output circuit 3 to receive the bias signal Bs, and generates a reference signal output Ro according to the bias signal Bs.

The comparison circuit 5 is coupled to the signal output circuit 3 to receive the first output signal Os1 and the second output signal Os2, and coupled to the reference voltage generation circuit 4 to receive the reference signal output Ro. The reference signal output Ro is compared with the first output signal Os1 and the second output signal Os2 to produce an accurate comparison output Co to indicate the load state of the speaker 12.

The sensing circuit 6 is coupled to the signal output circuit 3 to receive the feedback signal Fs, and generates a sensing signal So according to the feedback signal Fs.

The detection circuit 7 is coupled to the sensing circuit 6 to receive the sensing signal So, and coupled to the signal output circuit 3 to receive the first output signal Os1 and the second output signal Os2, and generates a rough detection output CCo used to indicate the load state of the speaker 12 according to the sensing signal So, the first output signal Os1, and the second output signal Os2.

The logic circuit 8 is coupled to the comparison circuit 5 and the detection circuit 7 to respectively receive the accurate comparison output Co and the rough detection output CCo, and obtains the load state of the speaker 12 according to the accurate comparison output Co and the rough detection output CCo to produce a detection result Tr. The logic circuit 8 is mainly composed of a basic logic gate and an output input variable, which may be a finished product known by a person having ordinary knowledge in the art to which the present disclosure belongs.

Figure 2:
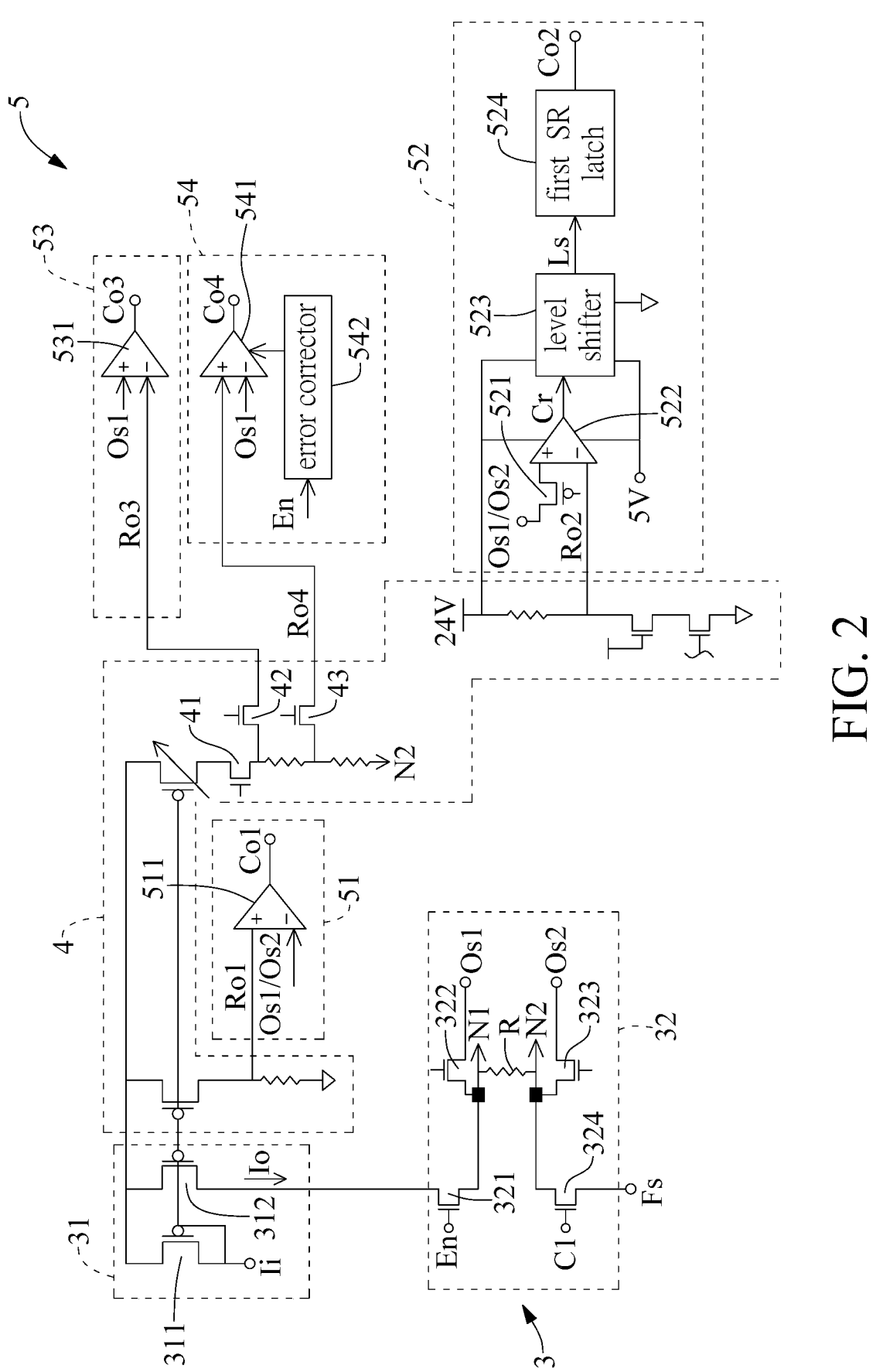
FIG. 2 is a circuit block diagram illustrating a signal output circuit, a reference voltage generation circuit, and a comparison circuit according to an embodiment of the present disclosure.

Further referring to FIG. 2, FIG. 2 is a schematic detailed circuit diagram of a signal output circuit 3, a reference voltage generation circuit 4, and a comparison circuit 5 according to an embodiment of the present disclosure.

The signal output circuit 3 includes a current generator 31 and a signal output device 32.

The current generator 31 is used to generate and output the forced current Io according to an input current Ii, and generate the bias signal Bs. The current generator 31 includes a second transistor 311 and a third transistor 312.

The second transistor 311 has a first end, a second end receiving the input current Ii, and a control end coupled to the second end itself. The third transistor 312 has a first end coupled to the first end of the second transistor 311, a second end outputting the forced current Io, and a control end coupled to the control end of the second transistor 311. The potential between the first end and the control end of the third transistor 312 is used as the bias signal Bs. The second transistor 311 and the third transistor 312 are each a P-type metal oxide semiconductor field effect transistor, wherein the source, drain, and gate are the first end, the second end, and the control end of each of the second transistor 311 and the third transistor 312, respectively. The second transistor 311 and the third transistor 312 are combined into a current mirror. The input current Ii, is for example, such as 10 microamps (uA), and the forced current Io, is for example, such as 1 milliampere (mA).

The signal output device 32 is controlled by an enabling signal En from the control circuit 9 to be enabled, and is coupled to the first load end N1 and the second load end N2, and coupled to the second end of the third transistor 312 of the current generator 31 to receive the forced current Io and output to the first load end N1. The signal output device 32 generates and outputs the first output signal Os1 and the second output signal Os2, and the feedback signal Fs. The signal output device 32 includes a fourth transistor 321, a fifth transistor 322, a sixth transistor 323, and a seventh transistor 324.

The fourth transistor 321 has a first end coupled to the second end of the third transistor 312 to receive the forced current Io, a second end coupled to the first load end N1, and a control end receiving the enabling signal En. The fourth transistor 321 is controlled by the enabling signal En to be conducted or not. The fifth transistor 322 has a first end coupled to the first load end N1, a second end providing a first output signal Os1, and a control end. The sixth transistor 323 has a first end coupled to the second load end N2, a second end providing the second output signal Os2, and a control end. The seventh transistor 324 has a first end coupled to the second load end N2, a second end providing the feedback signal Fs, and a control end receiving the control signal C1. The seventh transistor 324 is controlled by the control signal C1 to be conducted or not. The fifth transistor 322 and the sixth transistor 323 are controlled by the control circuit 9 to be conducted or not. A resistor R is the equivalent circuit of the speaker 42. The fourth transistor 321 to the seventh transistor 324 are each an N-type metal oxygen semiconductor field effect transistor, wherein the drain, source, and gate are respectively the first end, the second end, and the control end of each of the fourth transistor 321 to the seventh transistor 324.

The reference signal output Ro generated by the reference voltage generation circuit 4 includes a first reference voltage Ro1, a second reference voltage Ro2, a third reference voltage Ro3, and a fourth reference voltage Ro4. It should be noted that the configuration of the reference voltage generation circuit 4 as shown in FIG. 2, the transistor 41, the transistor 42, and the transistor 43 are controlled by the control circuit 9 to be conducted or not. The operation of how to generate the first reference voltage Ro1, the second reference voltage Ro2, the third reference voltage Ro3, and the fourth reference voltage Ro4 is well known by a person having ordinary knowledge of the technical field, for the sake of brevity, the description is not repeated herein.

The accurate comparison output Co produced by the comparison circuit 5 includes a first comparison signal Co1, a second comparison signal Co2, a third comparison signal Co3, and a fourth comparison signal Co4. The comparison circuit 5 includes a first comparison unit 51, a second comparison unit 52, a third comparison unit 53, and a fourth comparison unit 54.

The first comparison unit 51 compares one of the first output signal Os1 and the second output signal Os2 with the first reference voltage Ro1 to produce the first comparison signal Co1. The first comparison signal Co1 is used to indicate whether the load state of the speaker 12 is the short-circuited to ground state. The first comparison unit 51 includes a comparator 511, the comparator 511 has a non-inverting input end coupled to the reference voltage generation circuit 4 to receive the first reference voltage Ro1, an inverting input end coupled to the signal output circuit 3 to receive one of the first output signal Os1 and the second output signal Os2, and an output end outputting the first comparison signal Co1. For example, when the logic level of the first comparison signal Co1 is a high logic level "1", it indicates that the load state of the speaker 12 is a short-circuited to ground state.

The second comparison unit 52 compares one of the first output signal Os1 and the second output signal Os2 with the second reference voltage Ro2 to produce the second comparison signal Co2. The second comparison signal Co2 is used to indicate whether the load state of the speaker 12 is the short-circuited to power state. For example, when the logic level of the second comparison signal Co2 is a high logic level "1", it indicates that the load state of the speaker 12 is a short-circuited to power state. The second comparison unit 52 includes an eighth transistor 521, a comparator 522, a level shifter 523, and a first SR latch 524.

The eighth transistor 521 has a first end for receiving one of the first output signal Os1 and the second output signal Os2, a second end, and a control end controlled by the control circuit 9 to be conducted or not. The eighth transistor 521 is a P-type metal oxygen semiconductor field effect transistor, wherein the source, drain, and gate are the first end, the second end, and the control end of the eighth transistor 521, respectively.

The comparator 522 has a non-inverting input end coupled to the second end of the eighth transistor 521 to receive one of the first output signal Os1 and the second output signal Os2, an inverting input end receiving the second reference voltage Ro2, and an output end. The output end of the comparator 522 provides a comparison result Cr. The comparison result Cr is obtained by comparing one of the first output signal Os1 and the second output signal Os2 with the second reference voltage Ro2.

The level shifter 523 is coupled to the output end of the comparator 522 to receive the comparison result Cr, and generates and outputs a shifting signal Ls according to the comparison result Cr. The voltage swing of the comparison result Cr is different from that of the shifting signal Ls. The level shifter 523 is a circuit for shifting a signal from one logic level or voltage domain to another logic level or voltage domain, which may be a finished product known by a person having ordinary knowledge in the art to which the present disclosure belongs.

The first SR latch 524 is coupled to the level shifter 523 to receive the shifting signal Ls, and generates the second comparison signal Co2 according to the shifting signal Ls. The first SR latch 524 is composed of a plurality of logic gates, which may be a finished product known to a person having ordinary knowledge in the art to which the present disclosure belongs.

The third comparison unit 53 compares the first output signal Os1 with the third reference voltage Ro3 (e.g., 95 mV) to produce the third comparison signal Co3. The third comparison signal Co3 is used to indicate whether the load state of the speaker 12 is the open-circuited state. The third comparison unit 53 includes a comparator 531, the comparator 531 has a non-inverting input end coupled to the signal output circuit 3 to receive the first output signal Os1, an inverting input end coupled to the reference voltage generation circuit 4 to receive the third reference voltage Ro3, and an output end outputting the third comparison signal Co3. For example, when the logic level of the third comparison signal Co3 is a high logic level "1", it indicates that the load state of the speaker 12 is an open-circuited state.

The fourth comparison unit 54 compares the first output signal Os1 with the fourth reference voltage Ro4 (e.g., 1 mV) to produce the fourth comparison signal Co4. The fourth comparison signal Co4 is used to indicate whether the load state of the speaker 12 is the short-circuited state. For example, when the logic level of the fourth comparison signal Co4 is a high logic level "1", it indicates that the load state of the speaker 12 is a short-circuited state. The fourth comparison unit 54 includes a comparator 541 and an error corrector 542. The comparator 541 has a non-inverting input end coupled to the reference voltage generation circuit 4 to receive the fourth reference voltage Ro4, an inverting input end coupled to the signal output circuit 3 to receive the first output signal Os1, and an output end outputting the fourth comparison signal Co4. The error corrector 542 is controlled by an enabling signal En from the control circuit 9 to be enabled, which can be used to perform error calibration of the comparator 541. The error corrector 542 may be a finished product known by a person having ordinary knowledge in the art to which the disclosure belongs.

Figure 3:
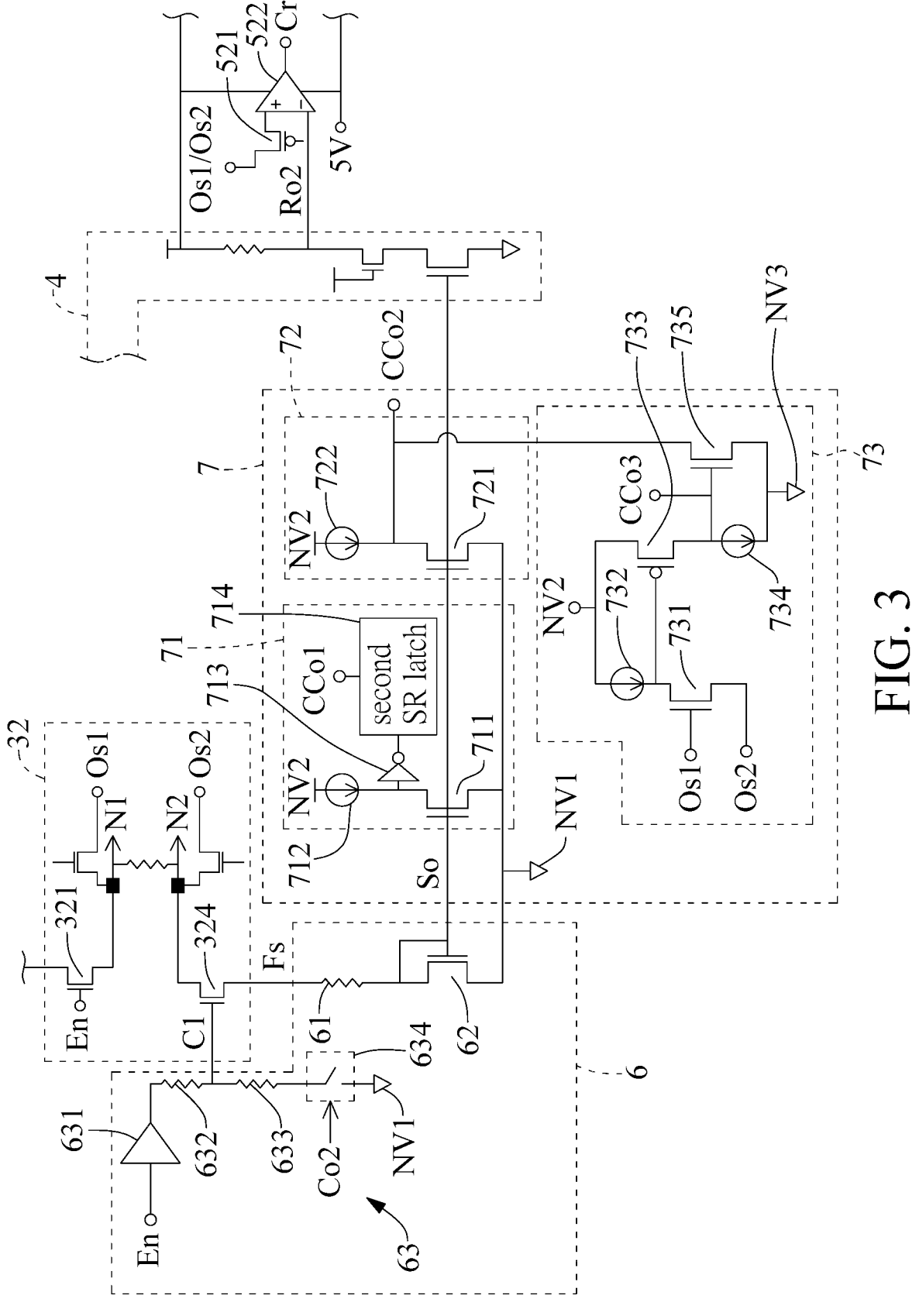
FIG. 3 is a circuit block diagram illustrating a sensing circuit and a detection circuit according to an embodiment of the present disclosure.

Further referring to FIG. 3, FIG. 3 is a schematic detailed circuit diagram of the signal output device 32, the sensing circuit 6, and the detection circuit 7 according to an embodiment of the present disclosure.

The sensing circuit 6 includes a first resistor 61, a first transistor 62, and a current limiting unit 63.

The first resistor 61 has a first end and a second end. The first end of the first resistor 61 is coupled to the second end of the seventh transistor 324 of the signal output device 32 to receive a feedback signal Fs. The first transistor 62 has a first end coupled to the second end of the first resistor 61, a second end coupled to a first reference voltage end NV1, and a control end coupled to the first end itself and providing a sensing signal So. The first transistor 62 is a diode-connected transistor. The first transistor 62 is an N-type metal oxygen semiconductor field effect transistor, wherein the drain, source, and gate are the first end, the second end, and the control end of the first transistor 62, respectively. The current limiting unit 63 is used to limit the current flowing into the first transistor 62 to prevent the first transistor 62 from burning. The current limiting unit 63 includes a buffer 631, a second resistor 632, a third resistor 633, and a switch 634.

The buffer 631 receives the enabling signal En from the control circuit 9, and generates a non-inverting signal according to the enabling signal En. The second resistor 632 has a first end coupled to the buffer 631 to receive the non-inverting signal, and a second end coupled to the control end of the seventh transistor 324. A level of the second end of the second resistor 632 (i.e., the control signal C1) is used to control the channel size of the seventh transistor 324 when conducted, so as to limit the current flowing into the first transistor 62. The third resistor 633 has a first end coupled to the second end of the second resistor 632, and a second end. The switch 634 is coupled between the second end of the third resistor 633 and the first reference voltage end NV1, and is controlled by a switching signal (i.e., the second comparison signal Co2) to be conducted or not.

The rough detection output CCo generated by the detection circuit 7 includes a first detection signal CCo1, a second detection signal CCo2, and a third detection signal CCo3. The detection circuit 7 includes a first detection unit 71, a second detection unit 72, and a third detection unit 73.

The first detection unit 71 is coupled to the control end of the first transistor 62 of the sensing circuit 6 to receive the sensing signal So, and generates the first detection signal CCo1 according to the sensing signal So. The first detection signal CCo1 is used to indicate whether the load state of the speaker 12 is the short-circuited to power state. For example, when the logic level of the first detection signal CCo1 is a high logic level "1", it indicates that the load state of the speaker 12 is a short-circuited to power state. The first detection unit 71 includes a ninth transistor 711, a first current source 712, an inverter 713, and a second SR latch 714.

The ninth transistor 711 has a first end, a second end coupled to the first reference voltage end NV1, and a control end coupled to the control end of the first transistor 62 to receive the sensing signal So. The first current source 712 is coupled between a second reference voltage end NV2 and the first end of the ninth transistor 711 to provide a first current (e.g., 15 microamperes (uA)). The inverter 713 is coupled to the first end of the ninth transistor 711, and generates an inverting signal according to a level of the first end of the ninth transistor 711. The second SR latch 714 is coupled to the inverter 713 to receive the inverting signal, and generates the first detection signal CCo1 according to the inverting signal. The ninth transistor 711 is an N-type metal oxygen semiconductor field effect transistor, wherein the drain, source, and gate are the first end, the second end, and the control end of the ninth transistor 711, respectively. The first transistor 62 and the ninth transistor 711 are combined into a current mirror, and the current flowing through the first end and the second end of the first transistor 62 and the current flowing through the first end and the second end of the ninth transistor 711 have a current ratio of 100 to 1.

The second detection unit 72 is coupled to the control end of the first transistor 62 of the sensing circuit 6 to receive the sensing signal So, and generates the second detection signal CCo2 according to the sensing signal So. The second detection signal CCo2 is used to indicate whether the load state of the speaker 12 is the short-circuited to ground state. For example, when the logic level of the second detection signal CCo2 is a high logic level "1", it indicates that the load state of the speaker 12 is a short-circuited to ground state. The second detection unit 72 includes a tenth transistor 721 and a second current source 722.

The tenth transistor 721 has a first end providing the second detection signal CCo2, a second end coupled to the first reference voltage end NV1, and a control end coupled to the control end of the first transistor 62 to receive the sensing signal So. The second current source 722 is coupled between the second reference voltage end NV2 and the first end of the tenth transistor 721 to provide a second current (e.g., 1 microampere (uA)). The tenth transistor 721 is an N-type metal oxygen semiconductor field effect transistor, wherein the drain, source, and gate are the first end, the second end, and the control end of the tenth transistor 721, respectively. The ninth transistor 711 and the tenth transistor 721 are combined into a current mirror, and the current flowing through the first end and the second end of the ninth transistor 711 and the current flowing through the first end and the second end of the tenth transistor 721 have a current ratio of 1 to 1.

The third detection unit 73 is coupled to the signal output device 32 to receive the first output signal Os1 and the second output signal Os2, and coupled to the second detection unit 72 to receive the second detection signal CCo2, and generates the third detection signal CCo3 according to the second detection signal CCo2 and the first output signal Os1 and the second output signal Os2. The third detection signal CCo3 is used to indicate whether the load state of the speaker 12 is the open-circuited state. For example, when the logic level of the third detection signal CCo3 is a high logic level "1", it indicates that the load state of the speaker 12 is an open-circuited state. The third detection unit 73 includes an eleventh transistor 731, a third current source 732, a twelfth transistor 733, a fourth current source 734, and a thirteenth transistor 735.

The eleventh transistor 731 has a first end, a second end coupled to the signal output device 32 to receive the second output signal Os2, and a control end coupled to the signal output device 32 to receive the first output signal Os1. The third current source 732 is coupled between the second reference voltage end NV2 and the first end of the eleventh transistor 731 to provide a third current (e.g., 1 microampere (uA)). The twelfth transistor 733 has a first end coupled to the second reference voltage end NV2, a second end providing the third detection signal CCo3, and a control end coupled to the first end of the eleventh transistor 731. The fourth current source 734 is coupled between the second end of the twelfth transistor 733 and a third reference voltage end NV3. The thirteenth transistor 735 has a first end coupled to the second detection unit 72 to receive the second detection signal CCo2, a second end coupled to the third reference voltage end NV3, and a control end coupled to the second end of the twelfth transistor 733. The eleventh transistor 731 and the thirteenth transistor 735 are each an N-type metal oxygen semiconductor field effect transistor, wherein the drain, source, and gate are the first end, the second end, and the control end of each of the eleventh transistor 731 and the thirteenth transistor 735, respectively. The twelfth transistor 733 is a P-type metal oxygen semiconductor field effect transistor, wherein the source, drain, and gate are the first end, the second end, and the control end of the twelfth transistor 733, respectively.

Figure 4:
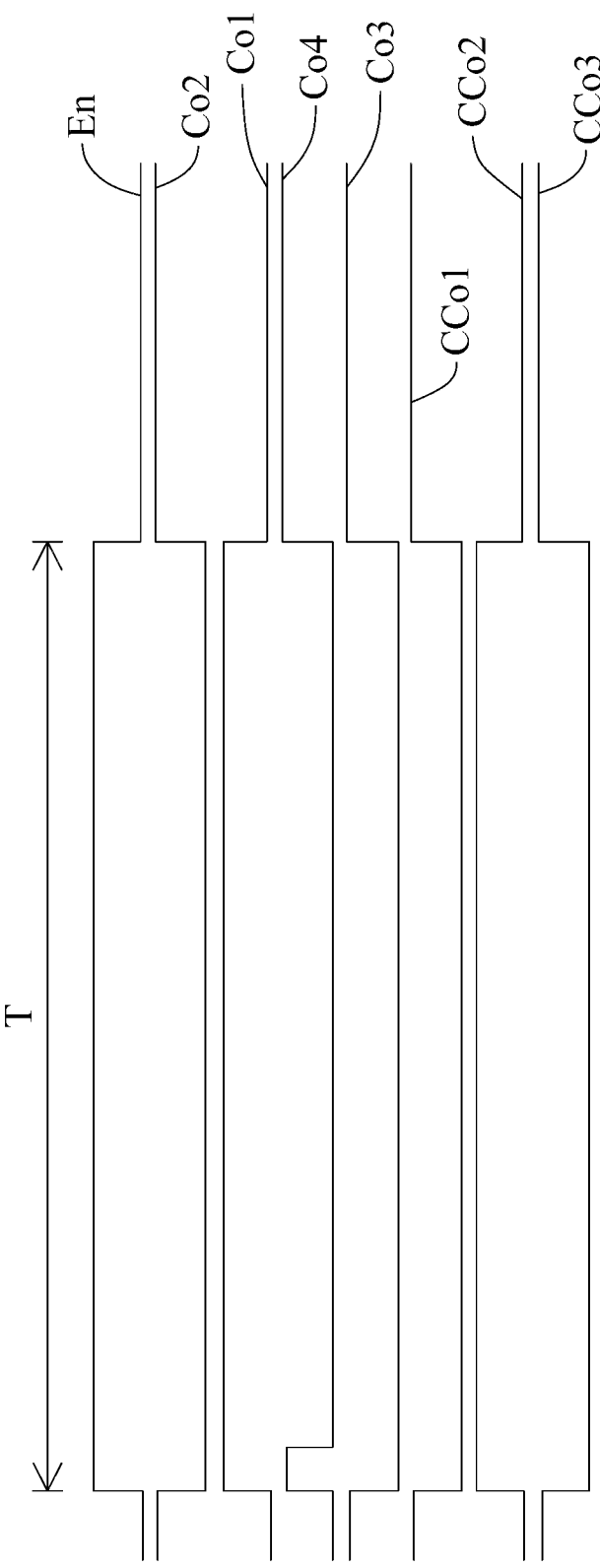
FIG. 4 is a schematic waveform diagram illustrating an enabling signal, a first comparison signal to a fourth comparison signal, and a first detection signal to a third detection signal of an embodiment of the present invention.

Referring to FIG. 4, FIG. 4 illustrates a waveform diagram of the enabling signal En, the first comparison signal Co1, the second comparison signal Co2, the third comparison signal Co3, the fourth comparison signal Co4, the first detection signal CCo1, the second detection signal CCo2, and the third detection signal CCo3 of an embodiment of the present disclosure during a detection cycle T when the load state of the speaker 12 is a short-circuited to ground state. It can be seen from FIG. 4 that only the logic level of the first comparison signal Co1 and the second detection signal CCo2 is a high logic level "1" at this time, therefore, the logic circuit 8 indicates that the load state of the speaker 12 is a short-circuited to ground state according to the detection result Tr generated by the first comparison signal Co1, the second comparison signal Co2, the third comparison signal Co3, the fourth comparison signal Co4, the first detection signal CCo1, the second detection signal CCo2, and the third detection signal CCo3.

In summary, since the load detection device 2 of the present disclosure uses the signal output circuit 3 to generate the forced current Io, the comparison circuit 5 compares the reference signal output Ro with the first output signal Os1 and the second output signal Os2 to generate an accurate comparison output Co, and the sensing circuit 6 generates the sensing signal So for the detection of the detection circuit 7 to generate a rough detection output CCo, the logic circuit 8 can obtain the load state of the speaker 12 according to the accurate comparison output Co and the rough detection output CCo, so the present disclosure does not need to be equipped with an analog to digital converter and/or digital to analog converter as the existing load detection device, and the load detection device 2 of the present disclosure has a smaller circuit area and compact design, so that the production of the load detection device 2 is easier to form an integrated circuit with the audio amplifier 11.

While the present invention has been described by means of preferable embodiments, the above description is merely embodiments of the invention, and it should not be considered to limit the implementing scope of the invention. All simple equivalent changes and modifications made according to the contents of claims and specification of the present invention are still intended to be embraced in the scope of the invention.

What is claimed is:

1. A load detection device for an audio amplifier system, the audio amplifier system comprises a first load end and a second load end that are coupled to a speaker, the load detection device comprising:

a signal output circuit, coupled to the first load end and the second load end for generating and outputting a forced current to the first load end, and generating a bias signal, a first output signal related to a level of the first load end, a second output signal related to a level of the second load end, and a feedback signal depending on the forced current;

a reference voltage generation circuit, coupled to the signal output circuit to receive the bias signal, and generates a reference signal output according to the bias signal;

a comparison circuit, coupled to the signal output circuit to receive the first and second output signals, and coupled to the reference voltage generation circuit to receive the reference signal output, and the reference signal output is compared with the first output signal and the second output signal to produce an accurate comparison output used to indicate a load state of the speaker;

a sensing circuit, coupled to the signal output circuit to receive the feedback signal, and generates a sensing signal according to the feedback signal;

a detection circuit, coupled to the sensing circuit to receive the sensing signal, and coupled to the signal output circuit to receive the first output signal and the second output signal, and generates a rough detection output used to indicate the load state of the speaker according to the sensing signal, the first output signal, and the second output signal;

a logic circuit, coupled to the comparison circuit and the detection circuit to respectively receive the accurate comparison output and the rough detection output, and obtains the load state of the speaker according to the accurate comparison output and the rough detection output to produce a detection result; and a control circuit, used to generate an enabling signal and output to the signal output circuit, the comparison circuit, the sensing circuit, and the logic circuit, so as to enable the signal output circuit, the comparison circuit, the sensing circuit, and the logic circuit.

2. The load detection device according to claim 1, wherein the sensing circuit comprises:

a first resistor, having a first end coupled to the signal output circuit to receive the feedback signal, and a second end;

a first transistor, having a first end coupled to the second end of the first resistor, a second end coupled to a first reference voltage end, and a control end coupled to the first end itself and providing the sensing signal; and a current limiting unit, used to limit the current flowing into the first transistor, the current limiting unit comprising:

a buffer, receiving the enabling signal from the control circuit, and generating a non-inverting signal according to the enabling signal;

a second resistor, having a first end coupled to the buffer to receive the non-inverting signal, and a second end, a level of the second end of the second resistor is used to limit the current flowing into the first transistor;

a third resistor, having a first end coupled to the second end of the second resistor, and a second end; and a switch, coupled between the second end of the third resistor and the first reference voltage end, and controlled by a switching signal to be conducted or not.

3. The load detection device according to claim 1, wherein the signal output circuit comprises:

a current generator, used to generate and output the forced current according to an input current, and generate the bias signal; and a signal output device, controlled by the enabling signal from the control circuit to be enabled, and coupled to the first load end and the second load end, and coupled to the current generator to receive the forced current and output to the first load end, the signal output device generates and outputs the first output signal and the second output signal, and the feedback signal.

4. The load detection device according to claim 3, wherein the current generator comprises:

a second transistor, having a first end, a second end receiving the input current, and a control end coupled to the second end itself; and a third transistor, having a first end coupled to the first end of the second transistor, a second end outputting the forced current, and a control end coupled to the control end of the second transistor.

5. The load detection device according to claim 3, wherein the signal output device comprises:

a fourth transistor, having a first end coupled to the current generator to receive the forced current, a second end coupled to the first load end, and a control end receiving the enabling signal;

a fifth transistor, having a first end coupled to the first load end, a second end providing a first output signal, and a control end;

a sixth transistor, having a first end coupled to the second load end, a second end providing the second output signal, and a control end; and a seventh transistor, having a first end coupled to the second load end, a second end providing the feedback signal, and a control end.

6. The load detection device according to claim 1, wherein the reference signal output comprises a first reference voltage, a second reference voltage, a third reference voltage, and a fourth reference voltage, the load state of the speaker comprises a short-circuited to ground state, a short-circuited to power state, a short-circuited state, and an open-circuited state, the accurate comparison output comprises a first comparison signal, a second comparison signal, a third comparison signal, and a fourth comparison signal, the comparison circuit includes a first comparison unit, comparing one of the first output signal and the second output signal with the first reference voltage to produce the first comparison signal, the first comparison signal is used to indicate whether the load state of the speaker is the short-circuited to ground state;

a second comparison unit, comparing the one of the first output signal and the second output signal with the second reference voltage to produce the second comparison signal, the second comparison signal is used to indicate whether the load state of the speaker is the short-circuited to power state;

a third comparison unit, comparing the first output signal with the third reference voltage to produce the third comparison signal, the third comparison signal is used to indicate whether the load state of the speaker is the open-circuited state; and a fourth comparison unit, comparing the first output signal with the fourth reference voltage to produce the fourth comparison signal, the fourth comparison signal is used to indicate whether the load state of the speaker is the short-circuited state.

7. The load detection device according to claim 6, wherein the second comparison unit comprises an eighth transistor, having a first end for receiving the one of the first and second output signals, a second end, and a control end;

a comparator, having a non-inverting input end coupled to the second end of the eighth transistor to receive the one of the first and second output signals, an inverting input end receiving the second reference voltage, and an output end, the output end provides a comparison result obtained by comparing the one of the first output signal and the second output signal with the second reference voltage;

a level shifter, coupled to the output end of the comparator to receive the comparison result, and generates and outputs a shifting signal according to the comparison result, the voltage swing of the comparison result is different from that of the shifting signal; and a first SR latch, coupled to the level shifter to receive the shifting signal, and generates the second comparison signal according to the shifting signal.

8. The load detection device according to claim 1, wherein the load state of the speaker comprises a short-circuited to ground state, a short-circuited to power state, and an open-circuited state, the rough detection output includes a first detection signal, a second detection signal, and a third detection signal, the detection circuit includes a first detection unit, coupled to the sensing circuit to receive the sensing signal, and generates the first detection signal according to the sensing signal, the first detection signal is used to indicate whether the load state of the speaker is the short-circuited to power state;

a second detection unit, coupled to the sensing circuit to receive the sensing signal, and generates the second detection signal according to the sensing signal, the second detection signal is used to indicate whether the load state of the speaker is the short-circuited to ground state; and a third detection unit, coupled to the signal output circuit to receive the first and second output signals, and coupled to the second detection unit to receive the second detection signal, and generates the third detection signal according to the second detection signal and the first and second output signals, the third detection signal is used to indicate whether the load state of the speaker is the open-circuited state.

9. The load detection device according to claim 8, wherein the first detection unit includes a ninth transistor, having a first end, a second end coupled to a first reference voltage end, and a control end coupled to the sensing circuit to receive the sensing signal;

a first current source, coupled between a second reference voltage end and the first end of the ninth transistor to provide a first current;

an inverter, coupled to the first end of the ninth transistor, and generates an inverting signal according to a level of the first end of the ninth transistor; and a second SR latch, coupled to the inverter to receive the inverting signal, and generates the first detection signal according to the inverting signal.

10. The load detection device according to claim 8, wherein the second detection unit includes a tenth transistor, having a first end providing the second detection signal, a second end coupled to a first reference voltage end, and a control end coupled to the sensing circuit to receive the sensing signal; and a second current source, coupled between a second reference voltage end and the first end of the tenth transistor to provide a second current.

11. The load detection device according to claim 8, wherein the third detection unit includes an eleventh transistor having a first end, a second end coupled to the signal output circuit to receive the second output signal, and a control end coupled to the signal output circuit to receive the first output signal;

a third current source, coupled between a second reference voltage end and the first end of the eleventh transistor to provide a third current;

a twelfth transistor, having a first end coupled to the second reference voltage end, a second end providing the third detection signal, and a control end coupled to the first end of the eleventh transistor;

a fourth current source, coupled between the second end of the twelfth transistor and a third reference voltage end; and a thirteenth transistor, having a first end coupled to the second detection unit to receive the second detection signal, a second end coupled to the third reference voltage end, and a control end coupled to the second end of the twelfth transistor.

* * * * *